(12) United States Patent
Hudait et al.

(10) Patent No.: US 7,573,059 B2
(45) Date of Patent: Aug. 11, 2009

(54) DISLOCATION-FREE INSB QUANTUM WELL STRUCTURE ON SI USING NOVEL BUFFER ARCHITECTURE

(75) Inventors: Mantu K. Hudait, Portland, OR (US); Mohamad A. Shaheen, Portland, OR (US); Loren A. Chow, Santa Clara, CA (US); Peter G. Tolchinsky, Beaverton, OR (US); Dmitri Loubychev, Bethlehem, PA (US); Joel M. Fastenau, Bethlehem, PA (US); Amy W. K. Liu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 11/501,253

(22) Filed: Aug. 2, 2006
(Under 37 CFR 1.47)

(65) Prior Publication Data

US 2008/0073639 A1    Mar. 27, 2008

(51) Int. Cl.
*H01L 29/06* (2006.01)
(52) U.S. Cl. .......... 257/14; 257/E29.068; 257/E29.081; 257/E29.091
(58) Field of Classification Search .......... 257/14, 257/17, 22, E29.068, E29.081, E29.091
See application file for complete search history.

(56) References Cited

U.S. PATENT DOCUMENTS

| | | | |
|---|---|---|---|
| 4,872,046 A | 10/1989 | Morkoc et al. | |
| 5,883,564 A | 3/1999 | Partin | |
| 6,133,593 A * | 10/2000 | Boos et al. | 257/194 |
| 6,320,212 B1 * | 11/2001 | Chow | 257/197 |
| 2002/0093332 A1 | 7/2002 | Schroeder et al. | |
| 2005/0040429 A1 * | 2/2005 | Uppal | 257/190 |

FOREIGN PATENT DOCUMENTS

JP    2005085916 A  *  3/2005

OTHER PUBLICATIONS

Akaha et al., JP2005-85916, Mar. 31, 2005, Machine translation in English.*
M Mori et al., Heteroepitaxial growth of InSb films on a Si(001) substrate via AlSb buffer layer, Applied Surface Science 216 (2003) pp. 569-574.
A. Wan et al., Characterization of GaAs grown by Molecular Beam Epitaxy on Vicinal Ge (100) Substrates. J. Vac. Sci. Technol. B 22(4) Jul./Aug. 2004, pp. 1893-1897.
R.M. Sieg et al., Toward device-quality GaAs Growth by Molecular Beam Epitaxy on Offcut Ge/SiGe/Si substrates, J. Vac. Sci. Technol. B 16(3), May/Jun. 1998, pp. 1471-1474.

(Continued)

*Primary Examiner*—Lex Malsawma
(74) *Attorney, Agent, or Firm*—Blakely, Sokoloff, Taylor & Zafman LLP

(57) ABSTRACT

A device grade III-V quantum well structure formed on a silicon substrate using a composite buffer architecture and the method of manufacture is described. Embodiments of the present invention enable III-V InSb quantum well device layers with defect densities below $1 \times 10^8$ cm$^{-2}$ to be formed on silicon substrates. In an embodiment of the present invention, an InSb quantum well layer is sandwiched between two larger band gap barrier layers. In an embodiment of the present invention, InSb quantum well layer is strained. In a specific embodiment, the two larger band gap barrier layers are graded.

17 Claims, 10 Drawing Sheets

OTHER PUBLICATIONS

S. Scholz et al., MOVPE Growth of GaAs on Ge Substrates by Inserting a Thin Low Temperature Buffer Layer, Cryst. Res. Technol. 41, No. 2 (2006), pp. 111-116.

M. Doczy et al., U.S. Appl. No. 11/305,452, Extreme High Mobility CMOS Logic, 12/152005.

* cited by examiner

DISLOCATION-FREE INSB QUANTUM WELL STRUCTURE ON SI USING NOVEL BUFFER ARCHITECTURE

BACKGROUND OF THE INVENTION

1. Field of the Invention

The present invention relates to integrating III-V semiconductor devices upon silicon substrates. More particularly this invention relates to the buffer layer between a III-V semiconductor device and a silicon substrate.

2. Discussion of Related Art

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as CMOS and quantum well (QW) transistors fabricated from extreme high mobility materials such as, but not limited to, indium antimonide (InSb), indium gallium arsenide ($In_xGa_{1-x}As$: x>0.53) and indium arsenide (InAs). Optical devices such as lasers, detectors and photovoltaics may also fabricated from various other direct band gap materials, such as, but not limited to, gallium arsenide (GaAs) and indium gallium arsenide (InGaAs). These devices can be further enhanced by monolithically integrating them with conventional devices of silicon and use of a silicon substrate has the additional advantage of cost reduction.

Despite all these advantages, the growth of III-V materials upon silicon substrates presents many challenges. Crystal defects are generated by lattice mismatch, polar-on-nonpolar mismatch and thermal mismatch between the III-V semiconductor epitaxial layer and the silicon semiconductor substrate. When the lattice mismatch between the epitaxial layer and substrate exceeds a few percent, the strain induced by the mismatch becomes too great and defects are generated in the epitaxial layer when the epitaxial film relaxes. Once the film thickness is greater than the critical thickness (film is strained below this thickness and relaxed above this thickness), the strain is relaxed by creating misfit dislocations at the film and substrate interface as well as in the epitaxial film. The epitaxial crystal defects are typically in the form of threading dislocations, stacking faults and twins (periodicity breaks where one portion of the lattice is a mirror image of another). Many defects, particularly threading dislocations and twins, tend to propagate into the "device layer" where the semiconductor device is fabricated. Generally, the severity of defect generation correlates to the amount of lattice mismatch between the III-V semiconductor and the silicon substrate. For these reasons, the large lattice mismatch (approximately 19.2% between the exemplary indium antimonide (InSb) and silicon (Si) combination) typically results in an epitaxial device layer having a high defect density, on the order of $1 \times 10^9$ cm$^{-2}$ to $1 \times 10^{10}$ cm$^{-2}$. The high defect density reduces the carrier mobility theoretically possible in bulk InSb, eliminating many of the technical advantages of "InSb-on-silicon" integration. For example, the electron mobility in bulk InSb films is estimated to be approximately 76,000 cm$^2$/Vs. However, to date, the best reported electron mobility of an InSb film formed over a silicon substrate is significantly lower, approximately 40,000-50,000 cm$^2$/Vs.

Similarly, a high defect density is also detrimental to photonic devices formed in or upon III-V semiconductor device layers on silicon substrates. The recombination-generation (R-G) energies of crystal defects are typically mid-gap, detracting from the performance of a semiconductor device layer that has been band gap engineered for a particular optical wavelength.

Various buffer layers have been used in attempts to relieve the strain induced by the lattice mismatch between the silicon substrate and the III-V device layer and thereby reduce the detrimental defect density of the device layer. For example, as shown in apparatus 100 of FIG. 1A, a material forms a buffer layer 170 between a silicon substrate 110 and a III-V device layer 180. A semiconductor device 190 is then fabricated in or upon device layer 180. Various materials have been utilized as the buffer layer 170. For example, an aluminum antimonide (AlSb) buffer layer 170 has been attempted as has a strontium titanate ($SrTiO_3$) buffer layer 170 between a silicon substrate 110 and a III-V device layer 180. In practice however, as depicted in FIG. 1B, these buffer layers are unable to prevent twins 171, threading dislocations 173 and stacking faults 175 from propagating into the III-V device layer 180 as twins 181, threading dislocations 183, and stacking faults 185. Thus, there remains a need for a buffer layer architecture that enables lower defect density III-V semiconductor device layers formed upon silicon substrates.

DETAILED DESCRIPTION OF THE PRESENT INVENTION

In various embodiments, a device grade III-V quantum well structure, formed on a silicon substrate using a composite buffer architecture, is described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 1A:
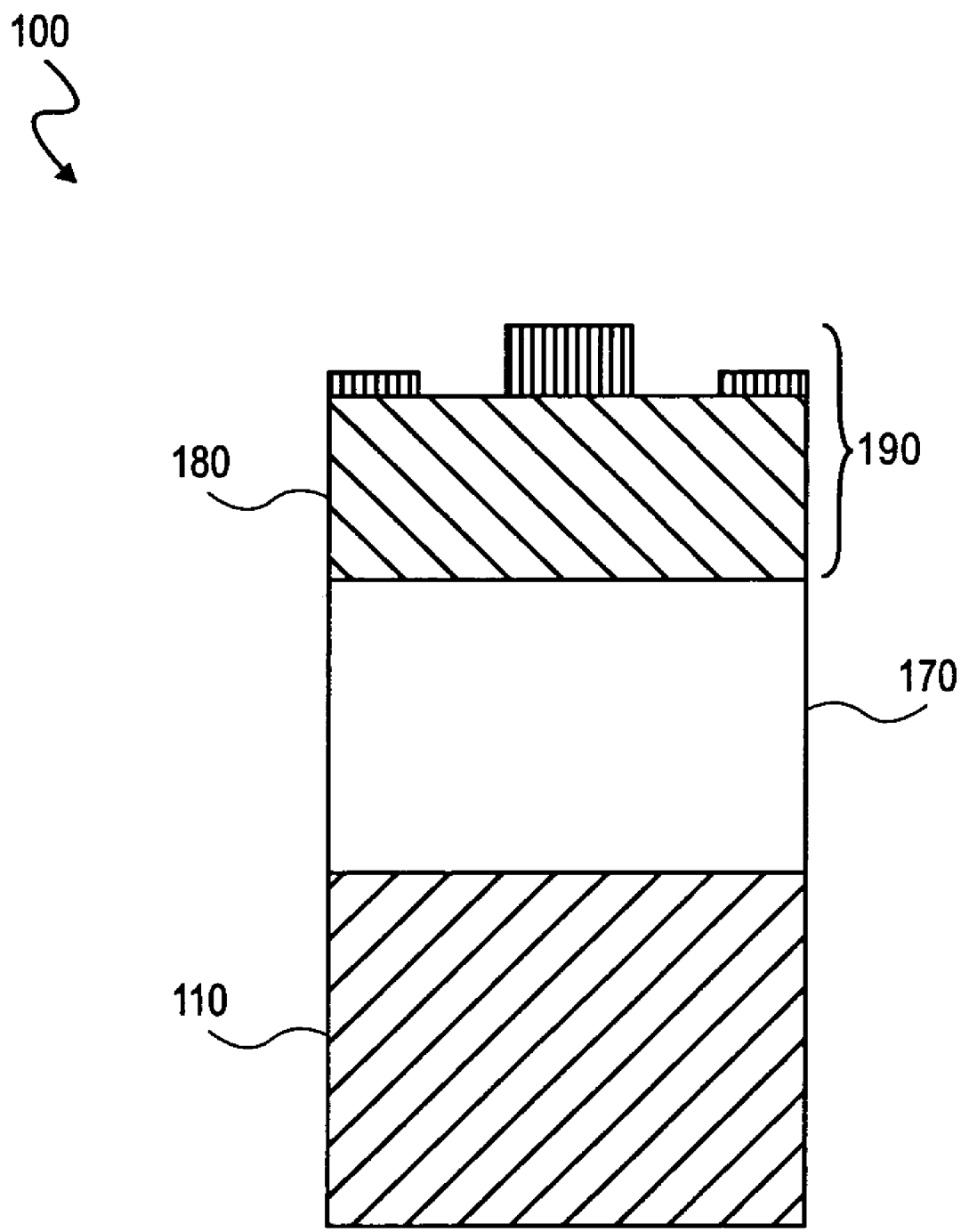
FIG. 1A is an illustration of a cross-sectional view of a conventional group III-V semiconductor device formed upon a silicon substrate.
Figure 1B:
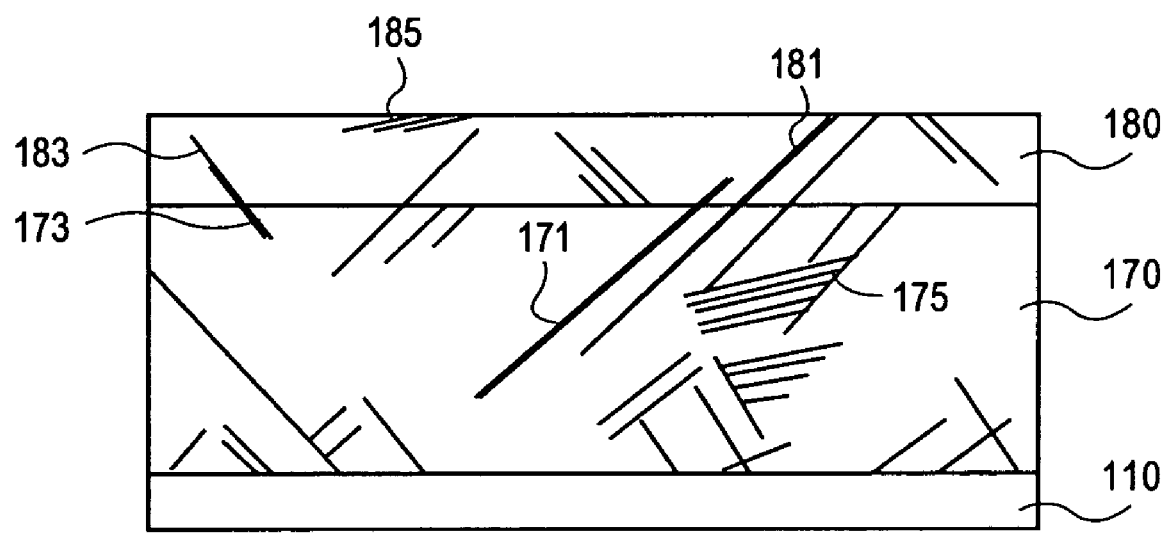
FIG. 1B is an illustration of a cross-sectional view of a conventional group III-V semiconductor device layer formed upon a silicon substrate.
Figure 2A:
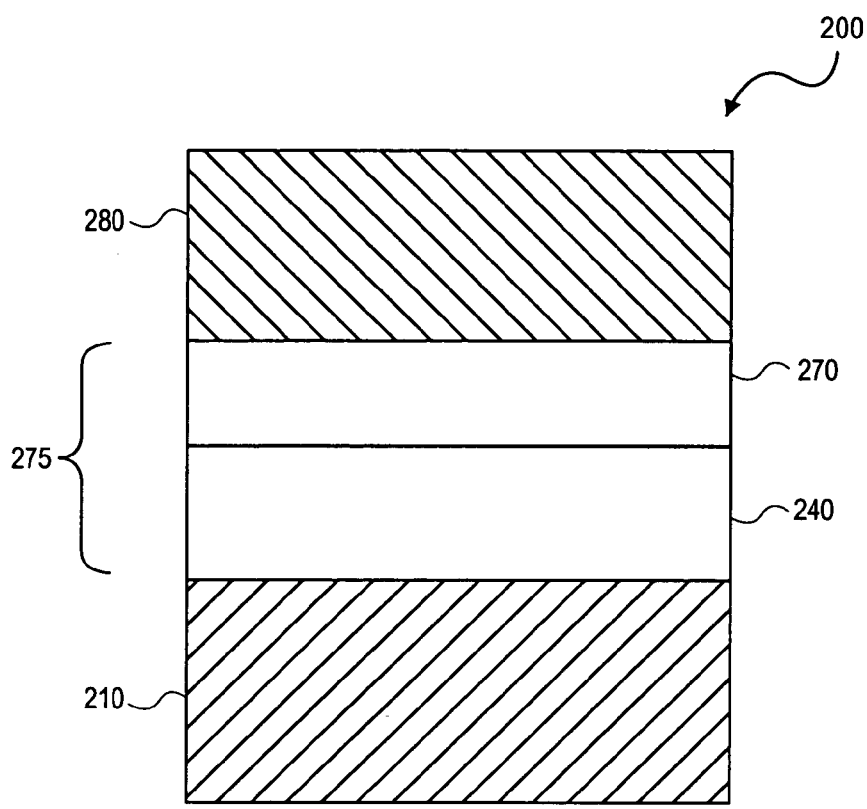
FIGS. 2A-2B are illustrations of a cross-sectional view of a group III-V semiconductor device layer formed upon a silicon substrate in accordance with the present invention.

Embodiments of the present invention reduce the dislocations within a III-V device layer formed over a silicon substrate to near bulk-like quality by utilizing a buffer architecture and specific fabrication techniques tailored to the particular III-V device layer desired. As shown in FIG. 2A, embodiments of the present invention utilize a composite buffer 275 formed between silicon substrate 210 and III-V device layer 280 to form a semiconductor stack 200. Specific embodiments utilize a composite buffer 275 of a first III-V semiconductor material, layer 240, and a second III-V semiconductor material, layer 270. In embodiments of the present invention, the composite buffer 275 architecture is engineered for a particular III-V device layer material 280 with the materials for the first III-V buffer layer 240 and second III-V buffer layer 270 selected with consideration of lattice constant, band gap and melting point for the purpose of controlling nucleation and propagation of defects generated by lattice mismatch strain.

In particular embodiments, the first III-V buffer layer 240 is formed on a vicinal surface of silicon substrate 210 having regular arrays of double-stepped (100) terraces across the substrate surface. A vicinal surface is a higher order crystal plane of the silicon substrate, such as, but not limited to the (211), (511), (013), (711) planes. A vicinal substrate surface having double-stepped terraces is capable of suppressing anti-phase domains (APD) in the first III-V buffer layer 240. An APD is created when a first polar crystal domain of layer 240, having group III atoms attached to the nonpolar silicon substrate surface, meets a second polar crystal domain of layer 240, having group V atoms attached to the silicon substrate. A crystal discontinuity forms in layer 240 at the border between these first and second domains providing recombination-generation centers detrimental to the operation of a semiconductor device. The term "polar" refers to the partially ionic bonding character between the constituents of a III-V compound semiconductor.

Embodiments providing the double atomic step in the silicon substrate 210 provide for a terrace level of sufficient depth to prevent the growth species of buffer layer 240 from bonding to a higher level terrace even after all binding sites in the lowest terrace are occupied. Thus, the double step terrace prevents ad-hoc surface bonding so that the growth of the first III-V buffer layer 240 proceeds in a stepwise fashion with each polar group III-V atomic bi-layer sequentially filling the lowest terrace of the nonpolar group IV, silicon substrate. In alternative embodiments, anti-phase domains are eliminated by growing layer 240 to a thickness greater than approximately 1.5 um. At such thicknesses, anti-phase domains are substantially annihilated and a single domain film can be formed even on first order planes, such as, but not limited to, the (100) silicon substrates commonly used for microelectronic fabrication.

In embodiments of the present invention, the total lattice mismatch between the silicon substrate and the III-V device layer is partitioned by the two III-V buffer layers, 240 and 270 comprising the composite buffer 275. Partitioning of the total lattice mismatch into three material interfaces provides an additional degree of freedom to incrementally control and direct the generation and propagation of the defects unavoidably formed by heteroepitaxy of materials having significantly different lattice constants. To partition the total lattice mismatch, each material layer within the composite buffer 275 possesses a lattice constant intermediate between the silicon substrate 210 and the desired III-V semiconductor device layer 280. Proper partitioning of the total lattice mismatch avoids too large of a lattice mismatch between adjacent materials. In a particular embodiment, the lattice constant of each material layer within the composite buffer 275 is intermediate between the layer upon which that layer is grown and the layer subsequently grown upon that layer. Thus, in a particular embodiment, the first III-V buffer layer 240 has a lattice spacing larger than the silicon substrate 210, the second III-V buffer layer 270 has a lattice spacing larger than the first III-V buffer layer 240 and the III-V device layer 280 has a lattice spacing larger than the second III-V buffer layer 270. In one such an embodiment, composite buffer 275 is comprised of a gallium antimonide (GaSb) layer 240 and an aluminum antimonide (AlSb) layer 270 formed between the silicon substrate 210 and an indium antimonide (InSb) device layer 280. The 6.09 Å lattice constant of GaSb layer 240 is approximately 12.2% larger than the 5.43 Å lattice constant of the silicon substrate 210 upon which layer 240 is formed. The 6.13 Å lattice constant of AlSb layer 270 is then approximately 0.65% larger than the GaSb layer 240. Finally, the 6.48 Å lattice constant of the InSb layer 280 is approximately 5.6% larger than the AlSb layer 270. Thus, in this particular embodiment, the lattice constant of the materials comprising the composite buffer 275 is gradually incremented from the lattice spacing of the silicon substrate 210 to the lattice spacing of the III-V device layer 280, thereby partitioning the total lattice mismatch between three separate material interfaces. In this manner, the InSb device layer 280 need only accommodate the strain of a 5.6% lattice mismatch with AlSb layer 270 rather than the entire 19.2% mismatch with the silicon substrate 210.

It should be appreciated that various III-V device layers, such as, but not limited to, indium arsenide (InAs) device layers may be similarly integrated with silicon substrates using other composite buffer embodiments. For example, in another embodiment of the present invention, buffer 275 is comprised of a gallium arsenide (GaAs) layer 240 and aluminum arsenide (AlAs) layer 270 is formed between the silicon substrate 210 and indium arsenide (InAs) device layer 280 to graduate the lattice constant between the layers 240 and 270 of the composite buffer 275 in a manner analogous to that just described for the InSb embodiment.

In embodiments of the present invention, the composite buffer 275 comprises materials which glide dislocations and terminate a significant percentage of the dislocations within the buffer layer 275. In particular embodiments, the first III-V buffer layer 240 is comprised of a relatively narrow band gap III-V semiconductor material. Generally, the extent of dislocation glide is dependent on the hardness of the material, with glide occurring more readily in softer materials. Semiconductor materials of narrower band gap are typically softer, and it has been found more dislocation glide occurs in narrower band gap materials. Furthermore, more of the dislocations are terminated or contained as the thickness of a material capable of dislocation glides is increased. In one particular embodiment, the first III-V buffer layer 240 is GaSb having a thickness between approximately 0.3 um and 5.0 um. GaSb readily glides defects because the band gap of GaSb is relatively narrow, approximately 0.7 eV. Dislocation glide occurring within the GaSb changes the direction a defect propagates.

This is particularly true for threading dislocations which typically propagate at an approximate sixty degree angle from the substrate surface. Gliding can change the direction of a threading dislocation to an angle more parallel to the surface of the film to terminate or contain the dislocations within the film as the buffer layer is thickened. For this reason, many of the defects induced by the strain of the 12.2% lattice mismatch between the silicon substrate 210 and a first III-V buffer layer 240 of GaSb are glided and contained within the GaSb layer 240. Because many such glided dislocations will not propagate into subsequently grown films, it is therefore possible to avoid simply accumulating defects within the subsequent epitaxial layers. Thus, embodiments utilizing a III-V buffer layer comprising at least one relatively narrow band gap III-V buffer material are capable of incrementing the lattice spacing without propagating the defects generated by the lattice spacing increment. In this manner, the lattice mismatch between the silicon substrate 210 and the first III-V buffer layer 240 can be partitioned by the buffer layers without accumulating the associated defects.

In a further embodiment, the III-V buffer layer with the greatest ability to glide dislocations accommodates the largest portion of the total lattice mismatch between the silicon substrate 210 and the III-V device layer 280. In one such embodiment, the composite buffer 275 comprises a first III-V buffer layer of GaSb and a second III-V buffer layer of AlSb. As previously discussed, the 6.09 Å lattice constant of GaSb layer 240 is approximately 12.2% larger than the 5.43 Å lattice constant of the silicon substrate 210 upon which layer 240 is formed. The 6.13 Å lattice constant of AlSb layer 270 is then approximately 0.65% larger than the GaSb layer 240. Because the band gaps of GaSb and AlSb are approximately 0.7 eV and 1.7 eV, respectively, the GaSb layer 240 is relatively softer and able to glide more dislocations than AlSb. Although the larger band gap AlSb has relatively less glide capability than GaSb, relatively fewer defects are introduced into the AlSb by the smaller strain from the 0.65% lattice mismatch between the GaSb layer 240 and AlSb layer 270. This is therefore another advantage the composite buffer 275 offers over a buffer comprised of a single layer of a material such as AlSb.

The interaction between the amount of lattice mismatch between two adjacent materials and the ability for a material to glide the ensuing dislocations is an important consideration of the design of composite buffer layer 275. For example, in an embodiment of the present invention utilizing GaAs for the first III-V buffer layer 240 and AlAs for the second III-V buffer layer 270, the relatively lower band gap of GaAs provides better gliding and lower defects than the wider band gap AlAs. For this reason, even though GaAs and AlAs have nearly the same lattice mismatch with the silicon substrate 210, a composite buffer of GaAs and AlAs will propagate fewer defects into a subsequently grown device layer than a buffer comprised of AlAs alone due to the lattice mismatch partitioning and the relatively better gliding ability of GaAs. In the same vein, it should be apparent that an embodiment utilizing GaSb provides better dislocation glide characteristics than an embodiment utilizing GaAs for the first III-V buffer layer 240 because the band gap of GaSb is lower than GaAs.

In embodiments of the present invention, the first III-V buffer layer 240 has a lower melting point than the second III-V buffer layer 270. The lower melting point temperature of the first III-V buffer layer 240 improves the thermal activation of dislocation glide within layer 240 during the subsequent growth of the second III-V buffer layer 270. A composite buffer architecture wherein the first III-V buffer layer 240 has a melting point that is lower than the melting point of the second III-V buffer layer 270 reduces the propagation of threading dislocations, stacking faults and twins into the second buffer layer 270. In a particular embodiment, for example, a first III-V buffer layer 240 of GaSb has a melting point of approximately 712 C. and a second III-V buffer layer 270 of AlSb has a melting point of approximately 1060 C. In another particular embodiment, the melting point of a GaAs layer 240 is approximately 1237 C. while the melting point of an AlAs layer 270 is approximately 1740 C. Generally, the lower the melting point of the material, the better the dislocation glide. As shown by these two exemplary embodiments, the relatively high melting points of aluminum containing compound semiconductor materials making them useful for the second III-V buffer layer 270 because the high temperature epitaxial growth process increases the thermally activated dislocation gliding in buffer layer 240, which is discussed in greater detail below.

In embodiments of the present invention, the composite buffer 275 provides a highly resistive buffer layer over which the III-V device layer 280 can be fabricated. Generally, semiconductor resistivity depends directly on the band gap of a material, with wider band gap materials having higher resistivity. If the band gap is greater than approximately 1.4 eV, the semiconductor is commonly referred to as "semi-insulating" or "isolative" because the resistivity of the material is very high, on the order of approximately $1 \times 10^7$ ohm-cm. GaAs and indium phosphide (InP) are two examples. Thus, while dislocation glide improves with smaller band gap, electrical resistivity improves with larger band gap. However, in embodiments of the present invention, both dislocation glide and isolation can be achieved with the composite buffer 275.

In particular embodiments, the composite buffer 275 includes a wide band gap buffer layer having a thickness ranging from approximately 0.2 um to many microns. Specifically, in one embodiment, a second III-V buffer layer 270 comprising AlSb having a thickness between approximately 0.2 um and 5.0 um provides high resistivity for excellent device isolation and low capacitance. Similarly, for a GaAs/AlAs composite buffer embodiment, the second III-V buffer layer 270 comprising AlAs is semi-insulating or highly resistive. In an alternate embodiment, the second III-V buffer layer 270 can be formed of an aluminum gallium antimonide alloy ($Al_xGa_{1-x}Sb$), wherein the Al content ranges from 0.1 to 1.0. In one such embodiment, the second III-V buffer layer 270 contains sufficient aluminum for the band gap to be at least approximately 1.4 eV and therefore semi-insulating. In a specific embodiment, the aluminum (Al) fraction, x, is between 0.3 and 0.6. This $Al_xGa_{1-x}Sb$ alloy may be a compositionally graded from GaSb to AlSb using either linear or step-graded compositions of Al. For example, the second III-V buffer layer can be graded from 0% Al at the interface of the first III-V buffer layer 240 to 60% Al at the interface of the III-V device layer 280. Optionally, the grading can be continued to 100% Al (AlSb) in the second III-V buffer layer. In still other embodiments, composite buffer layer 275 provides device isolation by doping at least one of the buffer layers 240 or 270 to a conductivity type that is complementary to the conductivity type of the devices formed in the III-V device layer 280. Such complementary doping provides junction isolation, as commonly known in the art. In one such embodiment, buffer layer 270 is p-type and device layer 280 comprises an n-type quantum well (QW) transistor.

Figure 3A:
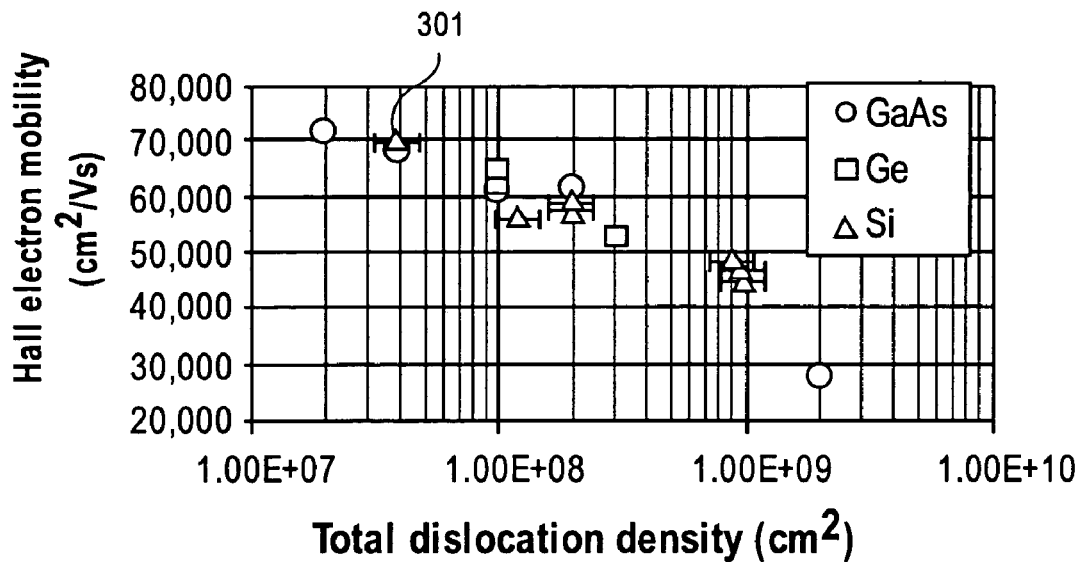
FIG. 3A is a graph of the dependency of defect density on carrier mobility of a III-V semiconductor device layer achieved with embodiments in accordance with the present invention.

In particular embodiments, the composite buffer 275 architecture achieves a device layer having an acceptably low final defect density. Shown in FIG. 3A is the dependency of Hall electron mobility of InSb formed on various substrates as a function of the InSb defect density. FIG. 3A indicates the InSb device layer defect density must be below $1\times10^8$ cm$^{-2}$ to approach the bulk InSb mobility of approximately 76,000 cm$^2$/Vs. Data point 301 represents an experimental measurement of a particular embodiment of the present invention wherein the composite buffer 275 of FIG. 2A is comprised of a GaSb layer 240 and an AlSb layer 270 between a silicon substrate 210 and InSb layer 280. For such embodiments, the composite buffer 275 accommodates the approximate 19% lattice mismatch between InSb device layer 280 and silicon substrate 210 to obtain a device layer having a defect density of approximately $4\times10^7$ cm$^{-2}$.

Figure 3B:
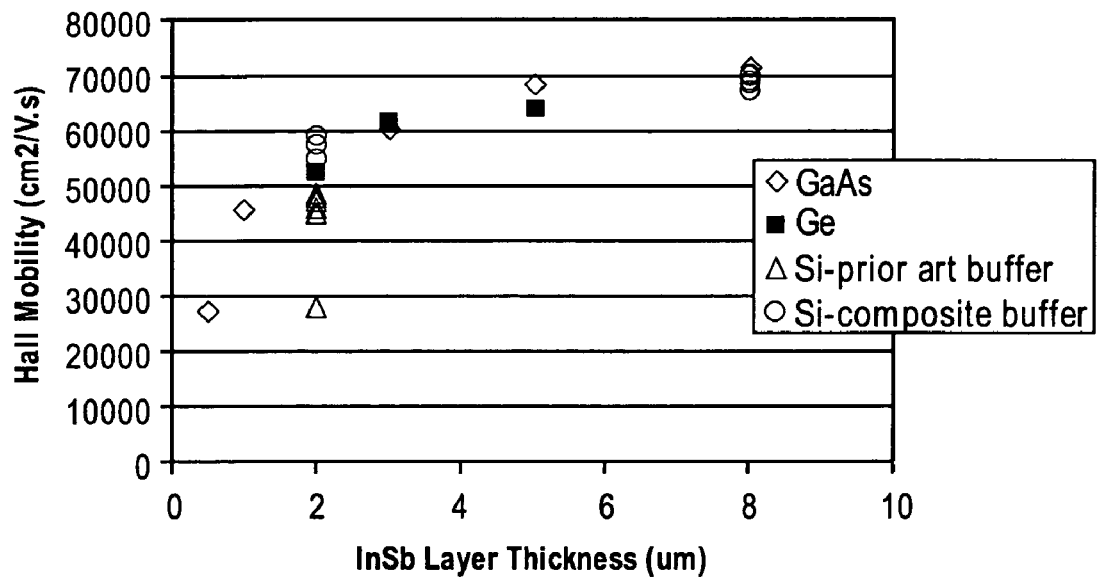
FIG. 3B is a graph of the carrier mobility of a III-V semiconductor device layer achieved with embodiments in accordance with the present invention.

In embodiments of the present invention, the III-V device layer 280 of FIG. 2A is of the desired material and of a sufficient thickness to achieve low defect density. Because the lattice spacing of the III-V device layer 280 is considered in the design of the composite buffer 275, the III-V device layer 280 has significantly less lattice mismatch relative to the composite buffer 275 than to the silicon substrate 210. A substantial portion of the defects in device layer 280 generated by lattice mismatch strain or propagated from the composite buffer 275 are glided within III-V device layer 280 as the thickness of 280 is increased. Thus, as shown in FIG. 3B, thicker device layers display superior Hall electron mobility. In a particular embodiment of the present invention incorporating a GaSb/AlSb composite buffer 275, an InSb device layer 280 less than 2.5 um thick displays a Hall-measured electron mobility of approximately 55,000-60,000 cm$^2$/Vs. In another particular embodiment of the present invention incorporating a GaSb/AlSb composite buffer 275, an InSb device layer 280 at least 7.5 um thick displays a Hall-measured electron mobility of approximately 70,000 cm$^2$/Vs. Thus, the present embodiments provide for device-grade InSb on silicon substrates enabling electronic structures such as quantum well transistors to be formed on silicon substrates.

Figure 2B:
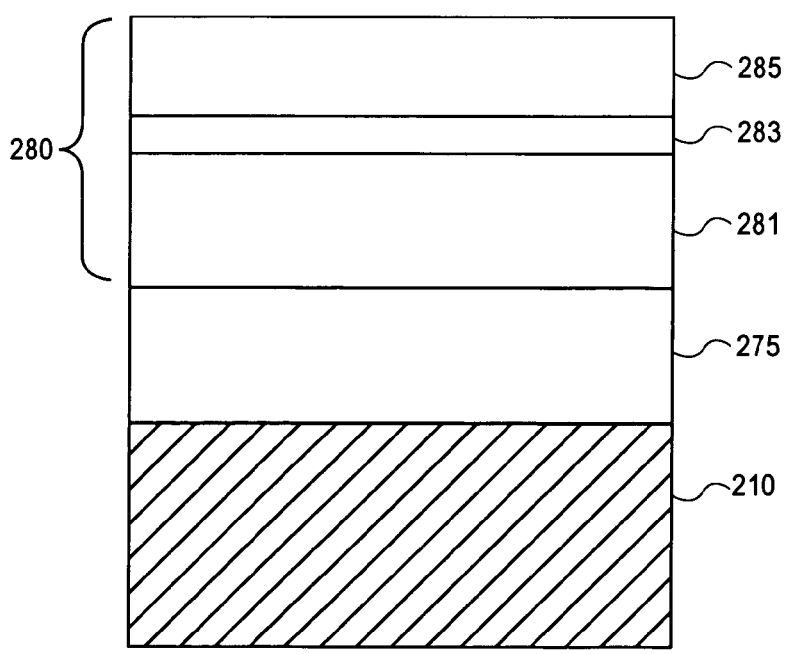

As shown in FIG. 2B, in an embodiment of the present invention, the III-V device layer 280 of the present invention may be comprised of a lower barrier layer 281, a quantum well layer 283, and upper barrier layer 285. In particular embodiments, the lower barrier layer 281 and upper barrier layer 285 are comprised of a material having a wider band gap than the quantum well layer 283, thereby confining a majority of charge carriers within the quantum well layer 283 for reduced device leakage. Specifically, in one embodiment the barrier layers 281 and 285 are comprised of aluminum indium antimonide, $Al_xIn_{1-x}Sb$, where x is between approximately 0.1 and 1.0, and the quantum well layer 283 is comprised of InSb. In certain embodiments, the quantum well layer 283 is strained. In one embodiment the barriers layers 281 and 285 have the same composition. In another embodiment upper barrier layer 285 has a wider band gap than lower barrier layer 281. In a specific embodiment the barrier layers 281 and 285 may be graded.

Figure 5A:
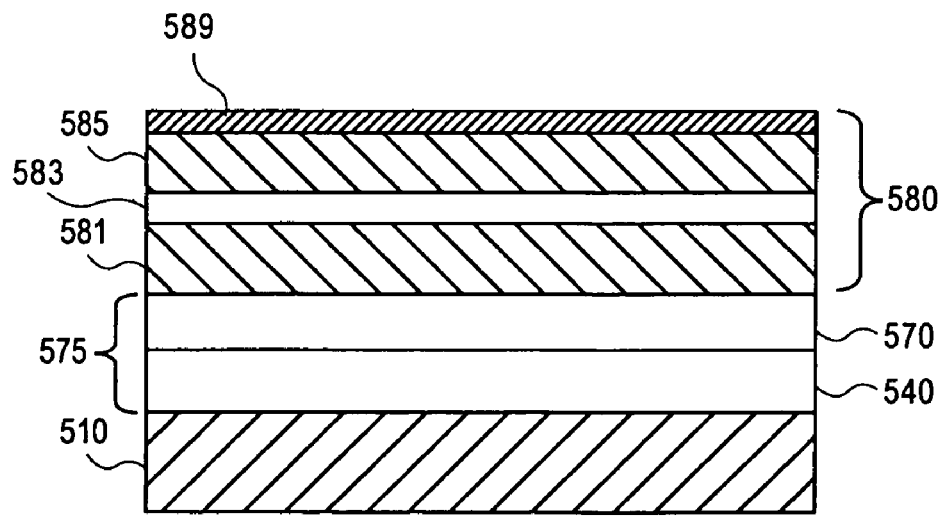
FIG. 5A-5D are still illustrations of cross-sectional views of a method of fabricating a quantum well (QW) transistor in accordance with the present invention.
Figure 5B:
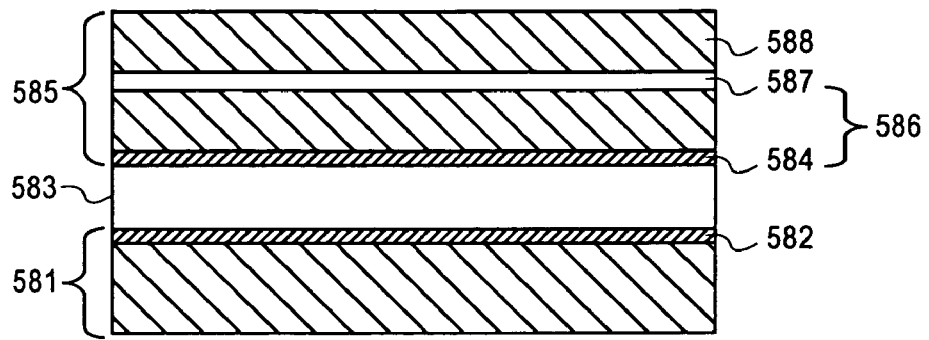
Figure 5C:
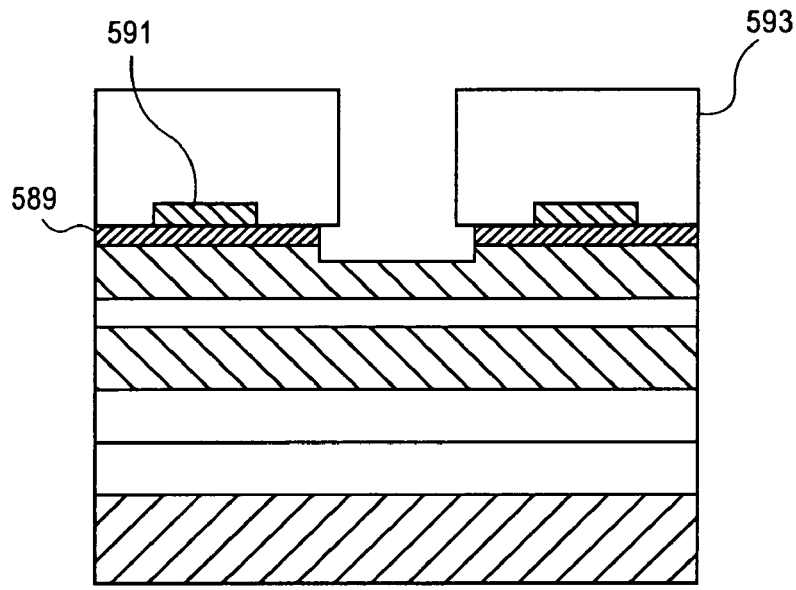
Figure 5D:
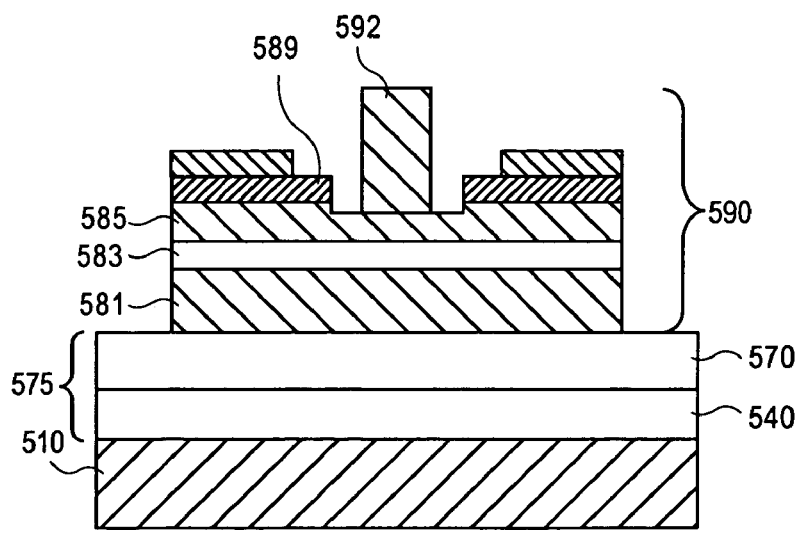
Figure 6:
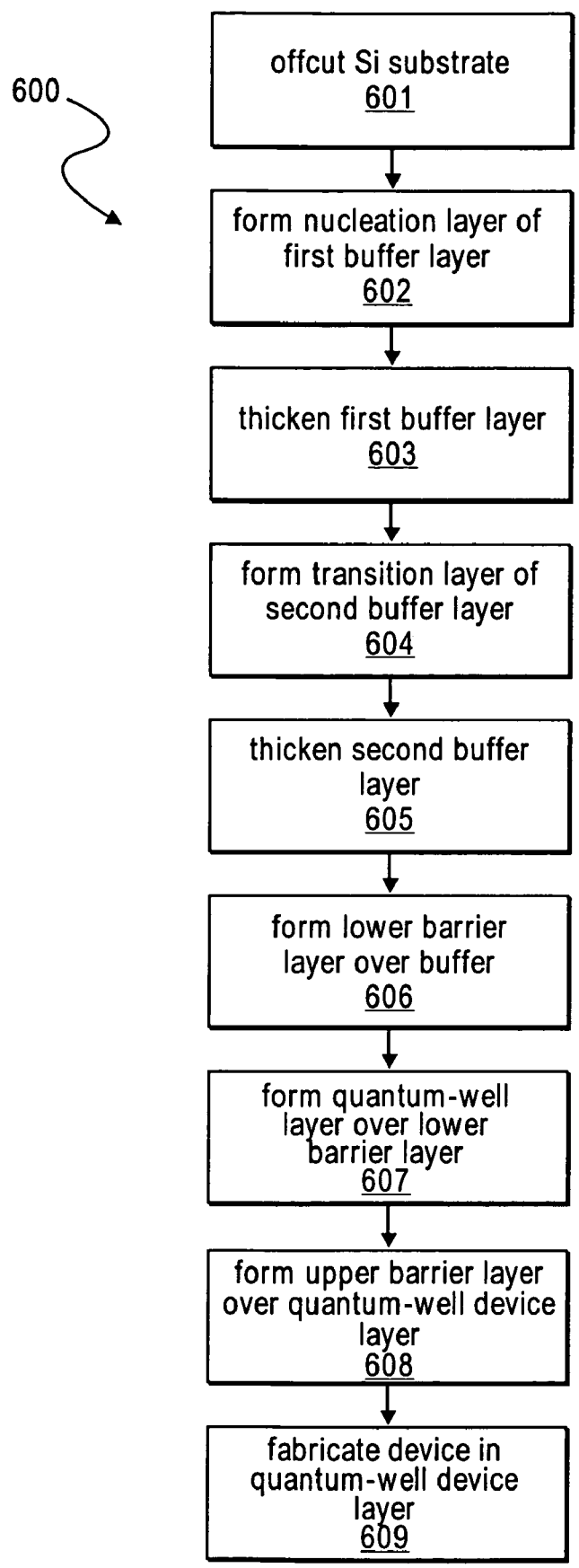
FIG. 6 is a flow diagram of a method of fabricating a group III-V semiconductor device layer upon a silicon substrate in accordance with the present invention.

FIG. 6 is a flow diagram of a method to fabricate a III-V device layer in accordance with an embodiment of the present invention. Method 600 of FIG. 6 begins with an offcut silicon substrate at step 601. At step 602, a nucleation layer is formed as the initial step of a two step process to form a first buffer layer. At step 603, the first buffer layer is thickened with a growth process distinct from that used at step 602. In step 604, a transition layer is formed as the initial step of a two step process to form a second buffer layer upon the first buffer layer. Then, at step 605, the second buffer layer is thickened with a growth process distinct from that used at step 604. In step 606, a lower barrier layer is formed over the composite buffer. The lower barrier layer may optionally be doped. For example, the lower barrier layer may include a modulation doped layer or delta doped layer as two examples. Then, at step 607 a quantum well layer is formed over the barrier layer. At step 608, an upper barrier layer is formed over the quantum well device layer. The upper barrier layer may optionally be doped. For example, the upper barrier layer may include a modulation doped layer or delta doped layer as two examples. Then, at step 609 a device is fabricated in the quantum well device layer. Each of these steps is discussed in greater detail below in reference to FIGS. 4A-5D.

Figure 4A:
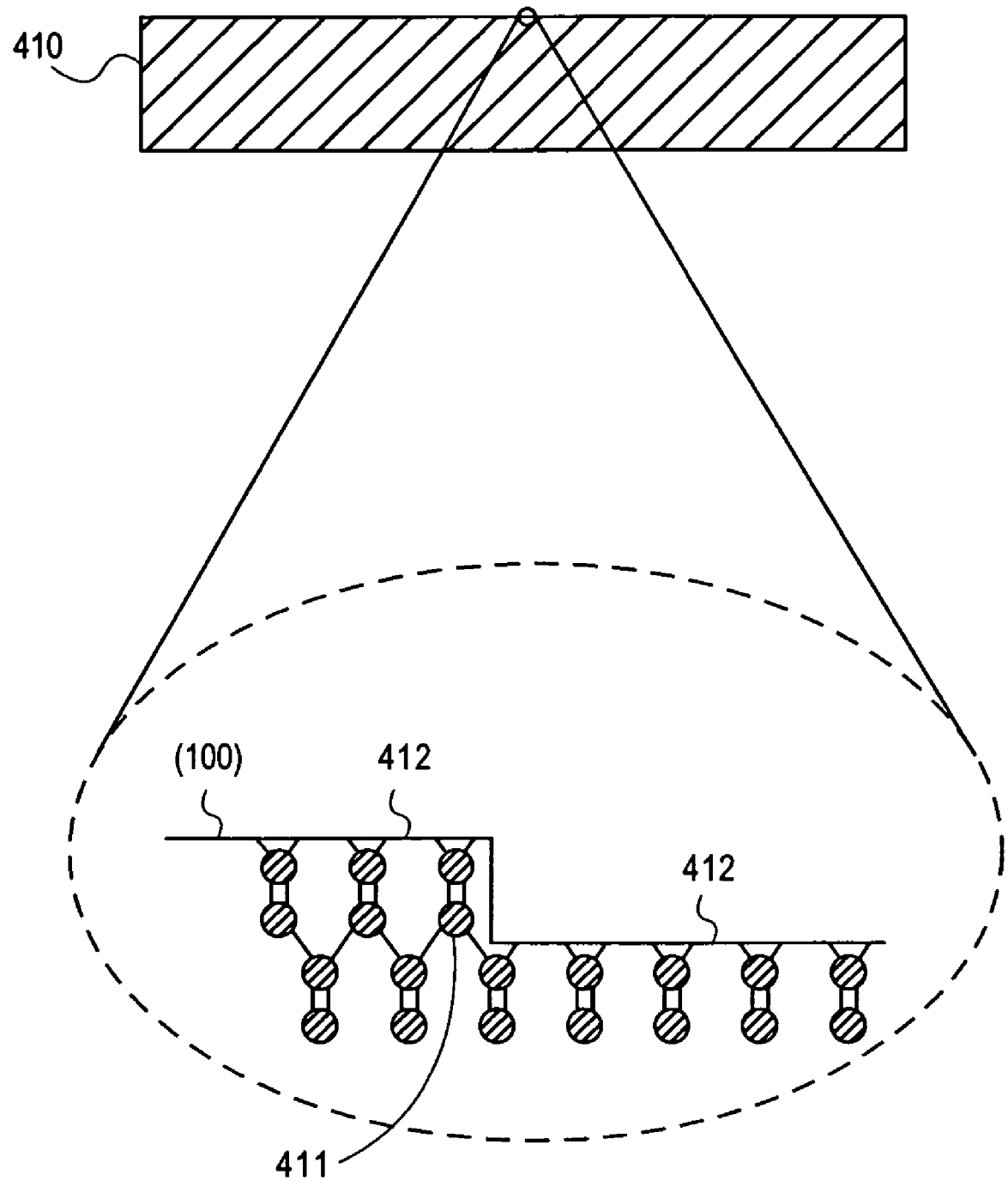
FIGS. 4A-4F are illustrations of cross-sectional views of a method of fabricating a group III-V semiconductor device layer upon a silicon substrate in accordance with the present invention.

Fabrication begins with silicon substrate 410. In a particular embodiment, substrate 410 has a vicinal surface, as shown in FIG. 4A. A vicinal surface is prepared by off-cutting the substrate from an ingot. In one such embodiment, the ingot is grown to provide wafer slices having (100) surfaces. The (100) substrate surface is then offcut at an angle between 2 and 12 degrees towards [110] the direction to produce a surface having terraces 412. Terraces 412 include a surface having a (100) crystal plane. The (100) plane surface area of each terrace 412 depends on the specific offcut angle, with a greater angle producing a greater number of terraces, each terrace having lesser (100) surface area. In such embodiments, the offcut produces a vicinal surface having an array of (100) terraces, many of which are separated by a double atomic step. As shown in the expanded view of FIG. 4A, a double step terrace has a height of two silicon atoms 411. In another embodiment, the silicon substrate offcut orientations are (211), (511), (013), (711) and other high index planes. Optionally, silicon substrate 410 is without an offcut (zero degree offcut), such as, but not limited to, common (100) substrates. Such a substrate (not pictured) typically does not have a substantial number of double atomic step terraces.

Next, the first III-V buffer layer is formed upon the silicon substrate 410. Commonly known growth techniques may be used to form the III-V buffer layers, such as, but not limited to, metalorganic chemical vapor deposition (MOCVD) or molecular beam epitaxy (MBE). As previously discussed, in particular embodiments, the buffer is formed in a manner that either avoids the formation of anti-phase domains (APD) or annihilates them as the film thickness is increased.

Figure 4B:
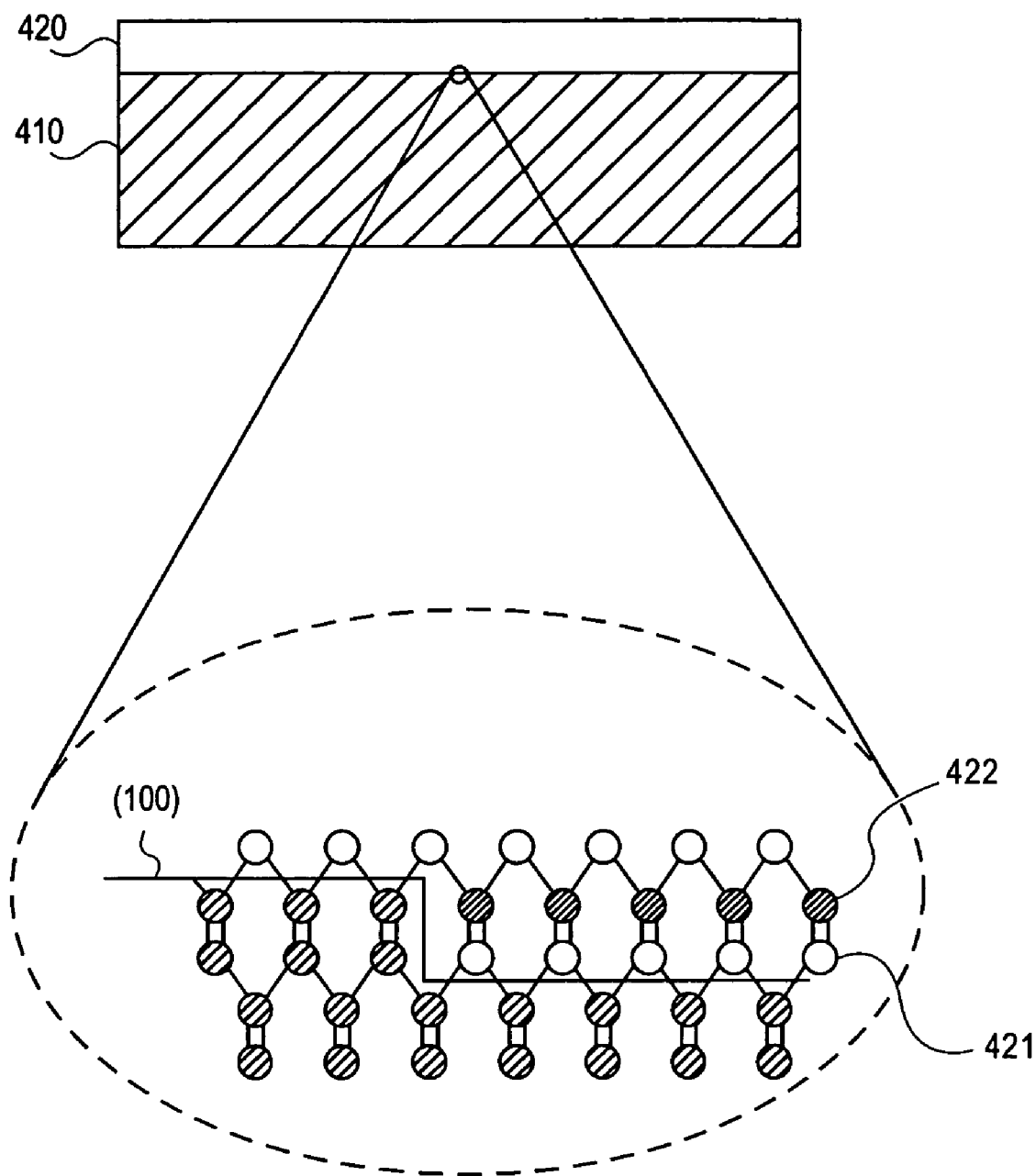
Figure 4C:
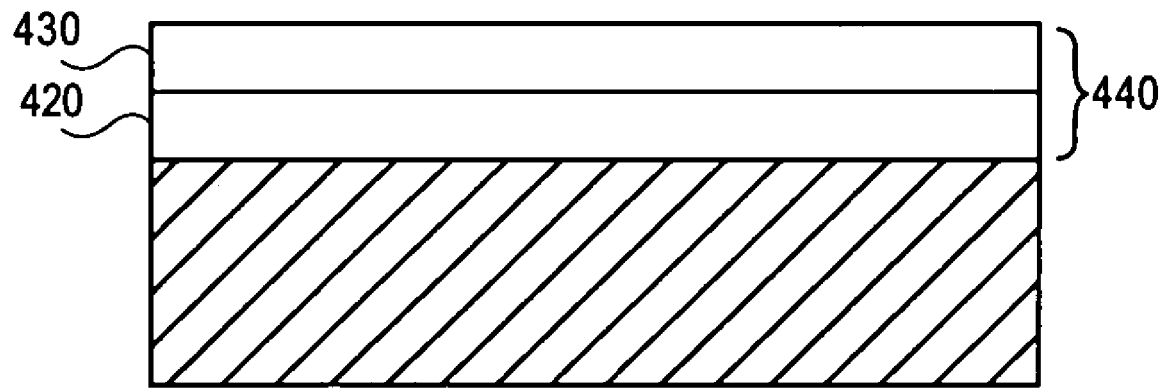

In a particular embodiment, as shown in FIG. 4B and FIG. 4C, the first II-V buffer layer is formed using a two step process, wherein the growth conditions of each step are distinct. In the first step, as shown in FIG. 4B, a nucleation layer 420 is formed. The growth of nucleation layer 420, as shown in the expanded view, successively fills the lowest silicon substrate terraces with atomic bi-layers of the III-V semiconductor buffer material. In this embodiment, the mobility of both the group III and group V species of the nucleation layer 420 are sufficiently high that the atomic species introduced to the silicon surface travel about the surface of silicon substrate 410 and either fall into a terrace or completely off the silicon substrate surface. A species which falls down a terrace wall lacks the energy to scale back up the terrace wall, therefore the otherwise substantially random species motion can be effectively funneled in a direction dictated by the substrate terracing. Once the species reaches the lowest terrace, the silicon substrate bonding sites are located by the mobile species until every site is filled. Because of the double atomic step in the silicon substrate 410, a terrace completely filled with species 421 presents a single atomic step which the mobile species is unable to scale, and so excess species travel off the substrate surface without a significant number bonding to sites in the upper terrace levels. Subsequent introduction of the second species of the polar atomic pair is similarly funneled to the lowest terrace to bond with the first atomic species 421 to completely fill the lowest terrace with species 422. The growth process then proceeds in this iterative fashion until all terraces are filled and no nonpolar silicon substrate surface remains, at which point there is no longer risk of forming an APD in the polar buffer materials. Thus, depending on the offcut angle of the substrate, the number of terraces which must be successively filled varies. As the offcut angle increases, the number of terrace levels increases and the thickness of the nucleation layer must be increased to fill every terrace. In particular embodiments, therefore, the nucleation layer 420 is between approximately 30 Å and approximately 500 Å.

The high mobility required to ensure the terraces are successively filled is provided for by the growth parameters of the nucleation layer 420 and these parameters therefore depend on the particular mobility characteristics of species comprising the material of layer 420. For example, in one embodiment, a nucleation layer 420 is formed using migration enhanced epitaxy (MEE) at a temperature of between 300 C. and 600 C. MEE proceeds in a fashion similar to that of atomic layer deposition (ALD). MEE has a relatively slower growth rate, approximately 0.1 um/hr, because once the group V element is introduced to the substrate there is a hold time during which both the group V source and group III source shutters are closed (shuttered). This hold time accommodates the relatively lower mobility of the group V species. No hold time is required for group III species because surface migration of this species relatively higher mobility. In a particular MEE embodiment, the substrate surface is exposed to an antimony (Sb) source for approximately 10 seconds to form a monolayer of Sb on the lowest terrace level. The Sb source and is then shuttered for a hold time of approximately 60 seconds. This relatively long hold time allows for the Sb species to migrate on the surface of the silicon substrate to ensure the bonding sites of the lowest terrace level are filled. Then, the substrate surface is exposed to a gallium (Ga) source for approximately 10 seconds. No hold time is required because of the high surface mobility of Ga. Next, the Sb is reopened for approximately 10 second and then again closed for a hold time. This process is repeated to form a GaSb nucleation layer 420 sufficiently thick to fill all the terraces of the silicon substrate 410, approximately 150 Å in a particular embodiment. In an embodiment, GaSb nucleation temperatures are in between 300 C. and 600 C. In particular GaSb embodiment, the MEE growth temperature is between approximately 400 C. and approximately 510 C. Higher temperature embodiments enable a higher quality film. In other embodiments, MEE can be utilized to form a nucleation layer of an alternate buffer material, such as, but not limited to GaAs.

In yet another embodiment, a nucleation layer 420 is formed on the vicinal silicon substrate 410 utilizing traditional MBE (without migration enhancement). The relatively higher flux of this particular embodiment using traditional MBE provides higher film growth rates and therefore higher throughput than MEE embodiments. In a particular MBE nucleation embodiment, GaSb is formed on the silicon substrate 410 at a temperature between approximately 400 C. and approximately 510 C. The high-flux embodiments are well suited to GaSb because of the relatively low vapor pressure and high sticking coefficient of antimony (Sb) as compared to arsenic (As) of GaAs films.

Next, as shown in FIG. 4C, a second growth step completes the formation of the first III-V buffer layer 440. This second growth step, performed at a higher temperature than that used for the nucleation layer 420, forms layer 430 to thicken the first III-V buffer layer 440 and glide dislocations. The film quality of layer 430 is superior to that of the nucleation layer 420 because it is formed at a higher growth temperature. Also, during the formation of layer 430, the flux rate can be relatively high because the polar nucleation layer 420 eliminates any danger of APD formation. In an embodiment, a GaSb film 430 is grown upon a GaSb nucleation layer 420 at a growth temperature in the range of 500 C and 700 C. In a particular embodiment, a GaSb film 430 is grown upon a GaSb nucleation layer 420 at a growth temperature between approximately 510 C. and approximately 570 C. In embodiments of the present invention, the GaSb film 430 is grown to a thickness between approximately 0.3 um and 5.0 um. In an alternate embodiment, a GaAs film 430 is grown in a similar fashion upon a GaAs nucleation layer 420.

In still another embodiment, the first III-V buffer layer 440 is formed on a traditional silicon substrate 410 having a lower order plane surface, such as, but not limited to (100). The first III-V buffer layer is grown without a nucleation step and permitted to formed anti-phase domains. In an embodiment, the single-step growth is performed at a temperature between 500 C. and 700 C. Once the film thickness is greater than approximately 1.5 um, the anti-phase domains are substantially annihilated and the film becomes single-domain. In a particular embodiment, a first III-V buffer layer 440 comprising between approximately 1.5 and 2.0 um GaSb is formed on a traditional (100) silicon substrate 410 that has a 0 degree offcut.

Figure 4D:
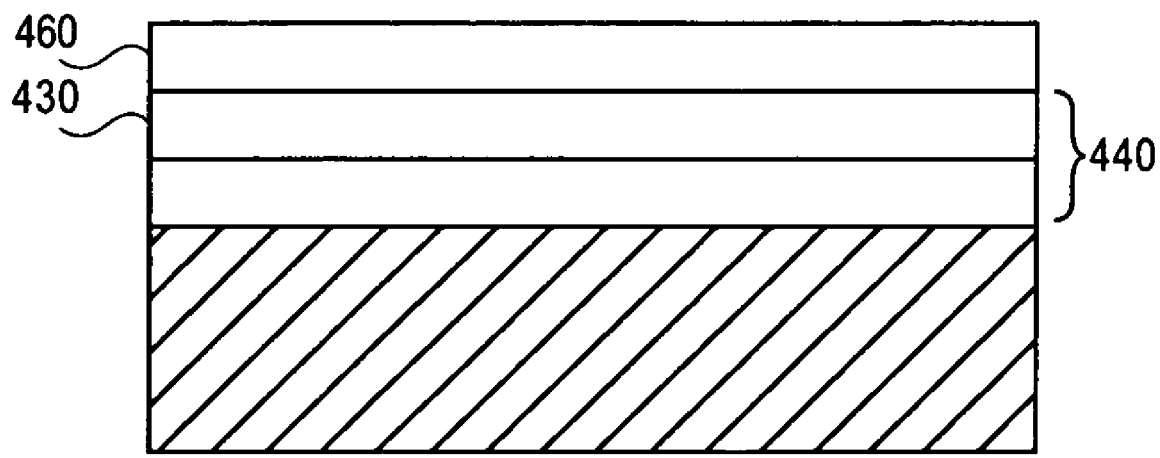

Following the completion of the first III-V buffer layer 440, a second III-V buffer layer 470 is formed. In particular embodiments, a two step growth process is utilized for form the second III-V buffer layer 470 wherein the growth conditions of each step are distinct. As shown in FIG. 4D, the first growth step forms a transition layer 460 upon the first III-V buffer layer 440. Transition layer 460 should be of sufficient thickness to prevent out migration of species from the first III-V buffer layer 440 during the growth of the isolative buffer material. In particular embodiments the thickness of the transition layer 460 is between approximately 0.05 um and 0.25 um. Out migration from the first III-V buffer layer 440 is a concern, especially for the high vapor pressure group V species, because, in certain embodiments, the isolative buffer material is grown at a higher temperature than the growth temperature of the first III-V buffer layer 440. To prevent out migration of the first III-V buffer layer 440 during formation of the transition layer 460, the growth temperature of transition layer 460 is no higher than the highest growth temperature of the III-V buffer layer 440. In an embodiment, AlSb transition layer 460 is be grown at the same growth temperature of GaSb layer 430. For example, in a specific embodiment wherein a GaSb layer 430 is grown at approximately 510 C., an AlSb transition layer 460 is also grown at approximately 510 C. to a thickness between 0.05 um and 0.2 um.

Figure 4E:
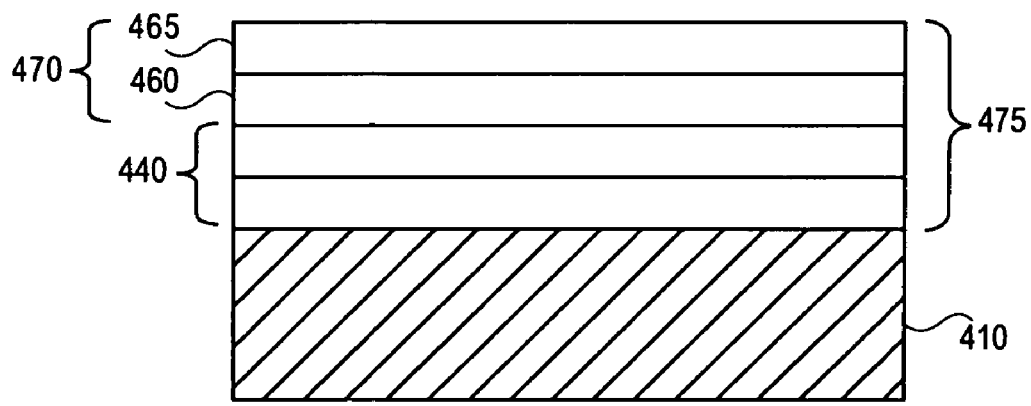

In particular embodiments, as shown in FIG. 4E, the second III-V buffer layer 470 is formed at temperature significantly higher than the highest growth temperature of the first III-V buffer layer 440. The higher growth temperature step forming layer 465 is limited by the melting point of the first III-V buffer layer 440. A high growth temperature serves two purposes. First, wide band gap semiconductors typically require relatively high temperatures to form high quality isolative films. For example, aluminum has relatively poor mobility and so aluminum containing films require a relatively higher deposition temperature to form films with a smooth surface. Second, the relatively higher growth temperature of layer 465 thermally activates dislocation glide within the first III-V buffer layer 440 to minimize the propagation of threading dislocations into the subsequently grown films. Thus, the high temperature growth step of the second III-V buffer layer 470 anneals the first III-V buffer layer 440.

In a further embodiment, an AlSb layer 465 is grown at a temperature between approximately 510 C. and approximately 570 C. upon an AlSb transition layer 460 over a GaSb buffer layer 440. The thickness of the layer 465 depends on the resistivity desired. In particular embodiments, the thickness of layer 465 is between approximately 0.2 um and 5.0 um. In a specific embodiment, an AlSb layer 465 is grown to approximately 1 um thick. In an alternative embodiment a thin AlSb layer 465 is grown to approximately 0.3 um thick in order to prevent origination of new defects such as twins and stacking faults. In another embodiment, a percentage of gallium (Ga) is included to form an $Al_xGa_{1-x}Sb$ buffer layer 465. In this embodiment, commonly known methods are used to incorporate between approximately 30% to approximately 60% aluminum (Al) so that the band gap of layer 465 is above approximately 1.4 eV. In certain embodiments, the second III-V buffer layer 470 comprising transition layer 460 and layer 465 may be step graded from the composition of the GaSb first III-V buffer layer until the desired band gap is reached or to the full band gap of AlSb. In such an embodiment, the composition of transition layer 460 can be integrated with the grading of layer 465 to form the graded second III-V buffer layer 470. In yet another embodiment, the second III-V buffer layer 470 can be in-situ doped to provide for junction isolation between the second III-V buffer layer 470 and a subsequently formed device layer. In such embodiments, either or both layers 460 and 465 of the second III-V buffer layer 470 may be doped. In a particular embodiment, the entire second III-V buffer layer 470 is doped p-type.

The interaction between the growth of the first III-V buffer layer 440 and the growth of second III-V buffer layer 470 is a further consideration in the architecture of the composite buffer. For example, in one embodiment, both the first III-V buffer layer 440 and second III-V buffer layer 470 are formed successively without breaking vacuum (in-situ). In a particular embodiment, an AlSb buffer layer 470 is grown in-situ upon a GaSb layer 440. While there is no detrimental interaction between a GaSb buffer layer 440 and an in-situ grown AlSb buffer layer 470, because the vapor pressure of antimony (Sb) is less than that of arsenic (As), an in-situ growth of an AlSb buffer layer 470 over a GaAs buffer layer 440 can result in a detrimental incorporation of As from the chamber walls of the epitaxial reactor into an in-situ grown AlSb buffer layer 470. Thus, the architecture of the composite buffer must consider the impact that growth of first III-V buffer layer 440 will have on the film quality of the second III-V buffer layer 470.

Figure 4F:
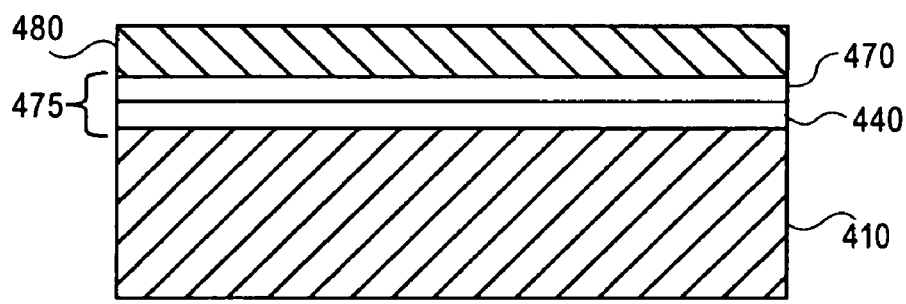

Finally, with the completion of the composite buffer 475, device layer 480 is formed, as shown in FIG. 4F. Device layer 480 is grown at a temperature appropriate for the particular III-V material desired. In a particular embodiment, wherein composite buffer 475 comprises a GaSb buffer layer 440 and AlSb buffer layer 470, an InSb device layer 480 is formed at a growth temperature between approximately 350 C. and approximately 475 C. Depending on the amount of lattice mismatch between the composite buffer 475 and the III-V device layer 480, as well as the ability for the device layer to glide dislocations, the device layer 480 is grown to a thickness sufficient to give an acceptable defect density. In a particular embodiment, an InSb device layer 480 is grown to a thickness greater than approximately 2 um. In a further embodiment, an InSb device layer 480 is grown to a thickness of approximately 8 um to achieve a defect density of approximately $4\times10^7$ cm$^{-2}$, referring back to FIG. 3A and FIG. 3B.

FIGS. 5A-5D depict embodiments of methods to fabricate a quantum well transistor in a III-V device layer on a substrate incorporating embodiments of the III-V buffer architecture discussed. FIG. 5A shows device layer 580 comprising a quantum well 583 between an upper barrier layer 585 and a lower barrier layer 581 formed upon the composite buffer 575 over silicon substrate 510.

Generally, the lower barrier layer 581 is formed of a higher band gap material than the overlying quantum well 583. The lower barrier layer 581 is of sufficient thickness to provide a potential barrier to charge carriers in the transistor channel. In one embodiment, the lower barrier layer thickness is between about 100 Å and about 250 Å. In other embodiments, the lower barrier is InAlSb between 2 um and 5 um thick. In still other embodiments, lower barrier layer 581 is microns thick to further reduce defect density in the quantum well 583. The lower barrier 581 may also be fully relaxed. In certain embodiments wherein the buffer 575 is comprised of a GaSb buffer layer 540 and AlSb buffer layer 570, the lower barrier layer 581 is comprised of aluminum indium antimonide ($Al_xIn_{1-x}Sb$). In some embodiments the lower barrier layer 581 comprises between about 10% and 100% aluminum, ($Al_xIn_{1-x}Sb$, with x=0.1–1.0). In a particular embodiment, the lower barrier layer 581 is $Al_xIn_{1-x}Sb$ with 15% aluminum ($Al_{0.15}In_{0.85}Sb$).

In some embodiments, the $Al_xIn_{1-x}Sb$ lower barrier layer 581 is grown between approximately 415 C. and 445 C. In general, the higher aluminum concentration, the higher the growth temperature. In a specific embodiment, a lower barrier layer 581 with 15% aluminum ($Al_{0.15}In_{0.85}Sb$) is grown at 415 C.

Additionally, the lower barrier 581 may be graded. In one embodiment, the lower barrier 581 is linearly graded from x=1.0 (AlSb) at the interface with the buffer layer 570 to x=0 (InSb) at the interface with the quantum well layer 583. In such an embodiment, the graded lower barrier layer 581 and subsequently grown InSb quantum well layer 583 are lattice matched at their interface, and the graded lower barrier layer 581 does not induce strain into the InSb quantum well layer 583.

In another embodiment, the lower barrier 581 is linearly graded from x=1.0 (AlSb) at the interface with the buffer layer 570 to x=0.1 ($Al_{0.1}In_{0.9}Sb$) at the interface with the quantum well layer 583. In such an embodiment, the lower barrier 581 induces strain in the subsequently grown quantum well layer 583. In some embodiments the lower barrier layer 581 is graded at a rate of less than 25% Al/um. In one embodiment, the lower barrier layer 581 is graded at a rate of 5% Al/um. Alternatively, the lower barrier 581 may be step graded using a series of layers with decreasing aluminum concentration. In one embodiment, the lower barrier 581 is step graded in a series of decreasing 5% (x=0.05) aluminum increments. In certain other embodiments, wherein the composite buffer 575 comprises GaAs buffer layer 540 and AlAs buffer layer 570, the lower barrier layer 581 is comprised of indium aluminum arsenide (InAlAs).

Over the lower barrier layer 581, a quantum well 583 is formed of a material with a smaller band gap than that of the lower barrier. In an embodiment wherein the composite buffer 575 comprises GaSb buffer layer 540 and AlSb buffer layer 570, the quantum well 583 is doped or undoped and formed of InSb. In some embodiments, where the quantum well layer 583 is formed of InSb, the growth temperature is between approximately 385 C. and 430 C. In a specific embodiment, the InSb quantum well layer 583 is grown at 400 C. In another embodiment wherein the composite buffer 575 comprises GaAs buffer layer 540 and AlAs buffer layer 570, the quantum well 583 is doped or undoped and formed of indium gallium arsenide ($In_xGa_{1-x}As$) or InAs, as two examples.

Quantum well 583 is of a sufficient thickness to provide adequate channel conductance. In a particular embodiment, the thickness of the quantum well 583 is between about 10 nm and about 50 nm. In certain embodiments quantum well layer 583 is below its critical thickness so that additional defects are not introduced due to lattice mismatch. The quantum well layer 583 may be strained by the lower barrier layer 581, the upper barrier layer 585, or both.

Over the quantum well 583 is the upper barrier layer 585. Upper barrier layer 585 has a larger band gap than the quantum well 583, thereby confining a majority of charge carriers within the quantum well 583 for reduced device leakage. The upper barrier layer 585 may be formed of the same or different materials as the lower barrier layer 581. In certain embodiments wherein the composite buffer 575 comprises a GaSb layer 540 and AlSb layer 570, the upper barrier layer 585 comprises aluminum indium antimonide ($Al_xIn_{1-x}Sb$). In some embodiments the upper barrier layer 585 comprises between about 10% and 40% aluminum, ($Al_xIn_{1-x}Sb$, with x=0.1-0.4). At above approximately 40% aluminum, the upper device layer may oxidize upon removal from the deposition chamber. In a particular embodiment, the upper barrier layer 585 is $Al_xIn_{1-x}Sb$ with 15% aluminum ($Al_{0.15}In_{0.85}Sb$). In an alternative embodiment, the upper barrier layer 585 may contain greater than 40% aluminum. In such an embodiment, a capping layer (not shown) may be deposited on the upper barrier layer 585 in order to suppress oxidation.

In another embodiment, as shown in FIG. 5B, the region 584 of the upper barrier layer 585 at the interface with the quantum well layer 583 has a lower lattice constant and larger band gap than the region 582 of the lower barrier layer 581 at the interface with the quantum well layer 583. Such a structure may be beneficial for more effectively confining charge carriers within the quantum well 583 for reduced device leakage. This may be accomplished, for example, by having a higher aluminum concentration in the upper $Al_xIn_{1-x}Sb$ barrier layer 585 than in the lower $Al_xIn_{1-x}Sb$ barrier layer 581. Increasing aluminum concentration, then leads to a larger band gap in $Al_xIn_{1-x}Sb$. In a particular embodiment, the upper barrier layer 585 contains 20% aluminum in the region 584 at the interface with quantum well layer 583, and lower barrier layer 581 contains 15% aluminum in the region 582 at the interface with quantum well layer 583.

Additionally, the amount of strain induced in the quantum well layer 583 may be tailored by controlling the thickness and lattice mismatch with the lower barrier layer 581 and upper barrier layer 585. In a specific embodiment, wherein the quantum well 583 is InSb and the lower barrier layer 581 and upper barrier layer 585 are composed of $Al_xIn_{1-x}Sb$ with 15% aluminum, the quantum well layer 583 is compressively strained.

The upper barrier 585 may also be graded. In one embodiment the upper barrier is graded from x=0 (InSb) in region 584 at the interface with the quantum well layer 583 to x=0.15 ($Al_{0.15}In_{0.85}Sb$). In such an embodiment, the InSb quantum well layer 583 and graded upper barrier layer 585 and are lattice matched at their interface, and the graded upper barrier layer 585 does not induce strain into the InSb quantum well layer 583. In another embodiment, the upper barrier 585 is linearly graded from x=0.1 ($Al_{0.1}In_{0.9}Sb$) in region 584 at the interface with the quantum well layer 583 to x=0.4 ($Al_{0.4}In_{0.6}Sb$) at the opposite surface. In such an embodiment, the upper barrier layer 585 may induce a strain in the quantum well layer 583. The upper barrier layer 585 may have various thicknesses and in certain embodiments the upper barrier layer 585 is between about 20 nm and 500 nm thick.

In certain other embodiments, wherein the composite buffer 575 comprises GaAs buffer layer 540 and AlAs buffer layer 570, the upper barrier layer 585 comprises indium aluminum arsenide (InAlAs).

In some embodiments, the lower barrier 581, the upper barrier layer 585, or both may be doped to supply carriers to the quantum well 583. In a specific embodiment, the upper barrier layer 585 includes a doped layer 587, as shown in FIG. 5B and supplies carriers where the quantum well is undoped. In one embodiment, doped layer 587 is delta doped. In another embodiment doped layer 587 is modulation doped. For an n-type device utilizing an $Al_xIn_{1-x}Sb$ upper barrier 585, the doping may be done using silicon (Si) or tellurium (Te) impurities, as two examples. In one embodiment the doped layer 587 is delta doped and has a thickness of approximately 3 Å to 5 Å. In other embodiments the doped layer 587 is modulation doped and has a thickness between approximately 5Å and 50 Å.

In some embodiments upper barrier 585 comprises spacer layer 586, doped layer 587, and top barrier layer 588. In such embodiments, region 584 of the upper barrier layer 585 is located in the spacer layer 586 at the interface with the quantum well layer 583. In embodiments where upper barrier 585 is comprised of $Al_xIn_{1-x}Sb$, doped layer 587 may be delta doped by closing the sources for In and Al. The source for Sb is optionally left open, and the source for an n-type dopant such as Te, for example, is opened. In such exemplary embodiments, delta doped layer 587 may comprise Te and Sb, or Te only. In a particular embodiment, spacer layer 586 is between approximately 30 Å and 100 Å thick, delta doped layer 587 is less than 25 Å thick, and top barrier layer 588 is between approximately 50 Å and 500 Åthick in order to confine two-dimensional electron gas (2DEG) carriers in the quantum well 583. Alternatively, in embodiments where upper barrier 585 is comprised of $Al_xIn_{1-x}Sb$, doped layer 587 may be modulation doped by opening the source for an n-type dopant such as Te, for example, while sources for Al, In, and Sb are also open. In a particular embodiment, spacer layer 586 is approximately 30 Å and 100 Å thick, modulation doped layer 587 has a thickness between approximately 5 Å and 50 Å, and top barrier layer 588 is between approximately 50 Å and 500 Å thick in order to confine two-dimensional electron gas (2 DEG) carriers in the quantum well 583.

Specific embodiments have been described where upper barrier 585 includes a doped layer 587. However, additional embodiments are within the scope of the invention where lower barrier layer 581 may alternatively or also be doped to supply carriers to the quantum well 583. For an n-type device utilizing an $Al_xIn_{1-x}Sb$ lower barrier 581, the doping may, for example, be done in situ using silicon (Si) or tellurium (Te) impurities, as two examples. In some embodiments, the lower barrier layer 581 may comprise a doped layer (not shown) similar to that described for upper barrier 585. The doped layer may be, for example, modulation or delta doped.

Finally, to complete device layer 580 as shown in FIG. 5A, a highly-doped source drain layer 589 is formed above the upper barrier layer 585. In a particular embodiment, the source drain layer 589 is n+ doped InSb between about 30 Å to about 300 Å thick.

As shown in FIG. 5C, source and drain contact metallizations 591 are then formed by commonly known deposition processes, such as electron beam evaporation or reactive sputtering. In various embodiments, as shown in FIG. 5C, a mask material 593 is used to selectively remove a portion of the semiconductor device stack in preparation for the placement of the gate electrode. Depending on whether a depletion mode or enhancement mode device is desired, selective etches may be used to form a recess having a particular depth. In certain embodiments implementing an enhancement mode device it is desirable to place the gate electrode close to the delta doped layer 591. In such an embodiment the top barrier layer 588 portion of upper barrier 585 may be etched to a thickness of 50 Å. In alternative embodiments implementing a depletion mode device, it may be desirable to have a thicker top barrier layer 588.

In particular embodiments, source drain layer 589 is removed during the gate recess etch to expose a suitable Schottky surface on the upper barrier layer 585. Commonly known dry or wet etch techniques may be utilized to form the gate recess. The etchant may be selective to the composition of the semiconductor, for example, in an embodiment, an n+ doped indium antimonide (InSb) source drain layer 589 is selectively removed using a wet etch process comprised of citric acid and peroxide. Through application of similar commonly known selective etch techniques, the recess etch depth may be tightly controlled by terminating on a stop layer grown upon the upper barrier layer 585 (not shown).

As shown in FIG. 5D, the gate electrode 592 is formed over the upper barrier layer 585. In some embodiments of the present invention, commonly known techniques are used to form the gate electrode 592 directly on the upper barrier layer 585, thereby creating Schottky junction through which the gate controls the quantum well 583. In other embodiments, commonly known techniques are used to form the gate electrode 592 on a dielectric layer over the upper barrier layer 585, thereby creating a MOS junction. In particular embodiments, the gate electrode 592 is formed using commonly known lift-off methods relying on lithography and highly directional deposition techniques, such as electron beam deposition, to separate the gate electrode 592 from the source drain layer 589.

Then, as shown in FIG. 5D, the quantum well transistor 590 is isolated using commonly known techniques. In particular embodiments, the epitaxial device layer of the quantum well transistor 590 is etched through to form an active device mesa upon the composite buffer 575 over silicon substrate 510. The isolation etch removes the source drain layer 589, upper barrier 585, quantum well 583 and lower barrier 581 along a perimeter of the active device to form the mesa. As previously described, the isolative character of the composite buffer 575 provides sufficient device isolation between the transistor 590 and neighboring devices. Thus, in particular embodiments, the isolation etch is stopped when the composite buffer 575 is exposed. This enables device isolation to be acheived with minimal topography. With the quantum well transistor 590 substantially complete, backend processing is performed using commonly known techniques to connect quantum well transistor 590 to the external environment.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A semiconductor structure comprising:
a silicon substrate;
a buffer layer comprising GaSb disposed on the substrate;
a lower barrier layer comprised of $Al_xIn_{1-x}Sb$, wherein x is between approximately 0.1 and 1.0, disposed over the buffer layer, the lower barrier layer having a first region;
a quantum well layer disposed on the first region of the lower barrier layer;
a upper barrier layer comprised of $Al_xIn_{1-x}Sb$, wherein x is between approximately 0.1 and 0.4, disposed on the quantum well layer, the upper barrier layer having a second region in contact with the quantum well layer;
wherein the quantum well layer has a narrower band gap than the lower and upper barrier layers, and the first region has a narrower band gap than the second region.

2. The structure of claim 1, wherein the buffer layer further comprises a nucleation layer comprising Ga and Sb.

3. The structure of claim 1, wherein the buffer layer is on a (100) surface of the silicon substrate that is offcut 2 to 12 degrees in the [100] direction.

4. The structure of claim 1, wherein the quantum well layer has a threading dislocation density of less than approximately $1 \times 10^8$ cm$^{-2}$.

5. The structure of claim 1, wherein x is approximately 0.2 where the upper barrier layer contacts the quantum well layer, and x is approximately 0.15 where the lower barrier layer contacts the quantum well layer.

6. The structure of claim 1, wherein the quantum well layer is strained and between approximately 10 nm and 50 nm thick.

7. A semiconductor structure comprising:
a silicon substrate;
a buffer layer comprising GaSb disposed on the substrate;
a graded lower barrier layer disposed over the buffer layer, the lower barrier layer having a first region;
a quantum well layer disposed on the first region of the lower barrier layer;
a upper barrier layer disposed on the quantum well layer, the upper barrier layer having a second region in contact with the quantum well layer;
wherein the quantum well layer has a narrower band gap than the lower and upper barrier layers.

8. The structure of claim 7, wherein the graded lower barrier is comprised of $Al_xIn_{1-x}Sb$, where x is approximately 1.0 at the interface with the buffer layer, and x is less than approximately 0.2 at the interface with the quantum well layer.

9. The structure of claim 7, wherein the second region has a lower lattice constant and more aluminum than the first region.

10. The structure of claim 7, wherein the upper barrier is graded.

11. A semiconductor structure comprising:
a silicon substrate;
a composite buffer layer comprising a GaSb layer disposed on the substrate and an $Al_xGa_{1-x}Sb$ layer disposed on the GaSb layer, wherein x is between approximately 0 and 1.0;
a lower barrier layer comprised of $Al_xIn_{1-x}Sb$ disposed over the buffer layer, wherein x is between approximately 0.1 and 1.0;
a strained InSb device layer having a threading dislocation density of less than approximately $1 \times 10^8$ cm$^{-2}$ disposed on the lower barrier layer; and
a upper barrier layer comprised of $Al_xIn_{1-x}Sb$ disposed on the InSb device layer, wherein x is between approximately 0.1 and 1.0;
wherein the InSb device layer has a narrower band gap than the lower and upper barrier layers.

12. The structure of claim 11, wherein the lower barrier layer is fully relaxed and between approximately 2 um and 5 um thick.

13. The structure of claim 11, wherein the upper barrier layer is between approximately 20 nm and 500 nm thick.

14. The structure of claim 11, wherein the upper barrier layer further comprises a doped layer.

15. The structure of claim 11, wherein the doped layer is delta doped with an n-type dopant.

16. The structure of claim 11, further comprising a device formed in the device layer, wherein the device is selected from the group comprising: an electronic device, an optical device, an electro-optical device.

17. The structure of claim 11, wherein the electronic device formed in the device layer is an NMOS quantum well transistor.

* * * * *

UNITED STATES PATENT AND TRADEMARK OFFICE
CERTIFICATE OF CORRECTION

| | |
|---|---|
| PATENT NO. | : 7,573,059 B2 |
| APPLICATION NO. | : 11/501253 |
| DATED | : August 11, 2009 |
| INVENTOR(S) | : Hudait et al. |

Page 1 of 1

It is certified that error appears in the above-identified patent and that said Letters Patent is hereby corrected as shown below:

On the Title Page:

The first or sole Notice should read

-- Subject to any disclaimer, the term of this patent is extended or adjusted under 35 U.S.C. 154(b) by 81 days. --.

In column 16, at line 14 delete, "[100]" and insert -- [110] --.

Signed and Sealed this

Seventh Day of September, 2010

David J. Kappos
*Director of the United States Patent and Trademark Office*